US012217950B2

(12) United States Patent
Sander et al.

(10) Patent No.: US 12,217,950 B2
(45) Date of Patent: Feb. 4, 2025

(54) MAGNET SYSTEM, SPUTTERING DEVICE AND HOUSING COVER

(71) Applicant: VON ARDENNE Asset GmbH & Co. KG, Dresden (DE)

(72) Inventors: Thorsten Sander, Dresden (DE); Klaus Schneider, Arnsdorf (DE); Frank Meissner, Dresden (DE); Goetz Grosser, Dresden (DE); Steffen Mosshammer, Rabenau (DE)

(73) Assignee: VON ARDENNE Asset GmbH & Co. KG, Dresden (DE)

( * ) Notice: Subject to any disclaimer, the term of this patent is extended or adjusted under 35 U.S.C. 154(b) by 155 days.

(21) Appl. No.: 17/985,175

(22) Filed: Nov. 11, 2022

(65) Prior Publication Data

US 2023/0154734 A1 May 18, 2023

(30) Foreign Application Priority Data

Nov. 12, 2021 (DE) .................. 10 2021 129 523.8

(51) Int. Cl.
  *H01J 37/34* (2006.01)
  *C23C 14/35* (2006.01)
(52) U.S. Cl.
  CPC .......... *H01J 37/3455* (2013.01); *C23C 14/35* (2013.01); *H01J 37/3405* (2013.01); *H01J 37/342* (2013.01)
(58) Field of Classification Search
  None
  See application file for complete search history.

(56) References Cited

U.S. PATENT DOCUMENTS

| 4,445,997 | A | 5/1984 | McKelvey | |
|---|---|---|---|---|
| 4,519,885 | A | 5/1985 | Innis | |
| 2003/0136672 | A1* | 7/2003 | Barrett | H01J 37/3435 204/298.22 |
| 2006/0157346 | A1* | 7/2006 | Cnockaert | H01J 37/3435 204/298.12 |

(Continued)

FOREIGN PATENT DOCUMENTS

| DE | 102014109991 A1 | 1/2016 |
|---|---|---|
| EP | 3137646 A1 | 3/2017 |
| JP | 2001286027 A | 10/2001 |

OTHER PUBLICATIONS

International Search Report issued for the corresponding Belgian patent application No. 202205766, dated Mar. 29, 2023, 14 pages (for informational purposes only).

(Continued)

*Primary Examiner* — Jason Berman
(74) *Attorney, Agent, or Firm* — VIERING, JENTSCHURA & PARTNER mbB

(57) ABSTRACT

Disclosed herein are systems, methods, devices for a magnet system that includes a housing with a housing interior. The magnet system also includes a magnet holder disposed in the housing interior and supported by the housing, preferably stationary with respect thereto. The magnet system also includes a housing cover forming a fluid-tight chamber when mated with the housing, wherein the housing cover includes a gear stage, a generator, and a rotary coupling that couples the gear stage to the generator.

20 Claims, 12 Drawing Sheets

(56) References Cited

U.S. PATENT DOCUMENTS

2014/0246312 A1\* 9/2014 Crowley ............ H01J 37/3479
204/298.08

OTHER PUBLICATIONS

Rosenloecher, Thomas, "Belastungsanalyse für Windenergieanlagen", Mar. 1, 2014, 4 pages (including 2 pages English translation).
German Search Report issued for the corresponding German Application No. 10 2021 129 523.8, dated Jul. 8, 2022, 6 pages (only for informational purposes).

\* cited by examiner

FIG. 4
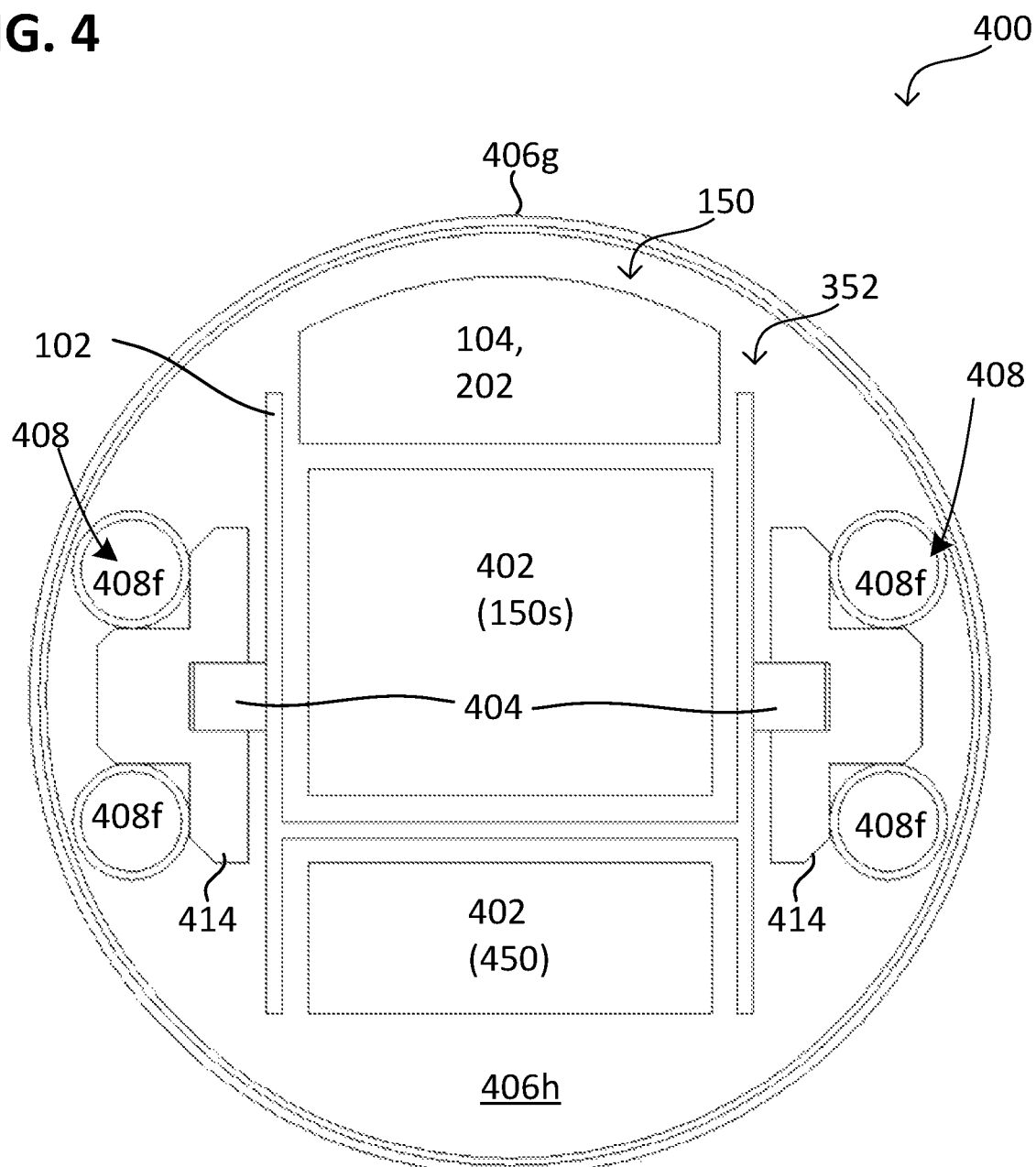
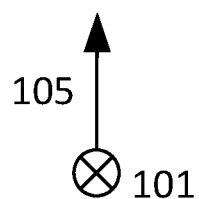

MAGNET SYSTEM, SPUTTERING DEVICE AND HOUSING COVER

CROSS-REFERENCE TO RELATED APPLICATION(S)

This application claims priority to German Patent Application No. 10 2021 129 523.8, filed on Nov. 12, 2021, the contents of which are fully incorporated herein by reference.

TECHNICAL FIELD

Various embodiments relate to a magnet system, a sputtering device, and a housing cover.

BACKGROUND

In general, workpieces or substrates may be processed, e.g., machined, coated, heated, etched, and/or structurally modified. For example, one process for coating a substrate is cathode sputtering (referred to as sputtering), which is of the physical vapor deposition (PVD) type. By means of sputtering (i.e., by means of a sputtering process), for example, one layer or plurality of layers may be deposited on a substrate. For this purpose, a plasma-forming gas may be ionized by means of a cathode, and a material to be deposited (target material) may be sputtered by means of the plasma formed in the process. The atomized target material may then be brought to a substrate on which it may be deposited and form a layer.

Modifications of cathode sputtering are sputtering by means of a magnetron, so-called magnetron sputtering, or so-called reactive magnetron sputtering. In this process, the formation of the plasma may be supported by means of a magnetic field. The magnetic field may be generated by a magnet system and penetrate the cathode (then also referred to as magnetron cathode) so that a toroidal plasma channel, a so-called racetrack, may be formed on the surface of the target material (target surface) in which plasma may form.

BRIEF DESCRIPTION OF THE DRAWINGS

In the drawings, like reference characters generally refer to the same parts throughout the different views. The drawings are not necessarily to scale, emphasis instead generally being placed upon illustrating the exemplary principles of the disclosure. In the following description, various exemplary aspects of the disclosure are described with reference to the following drawings, in which:

FIGS. 1-3A each show a magnet system according to various embodiments in different views;

FIG. 4 shows a sputtering device according to various embodiments, and

DESCRIPTION

Figure 1:
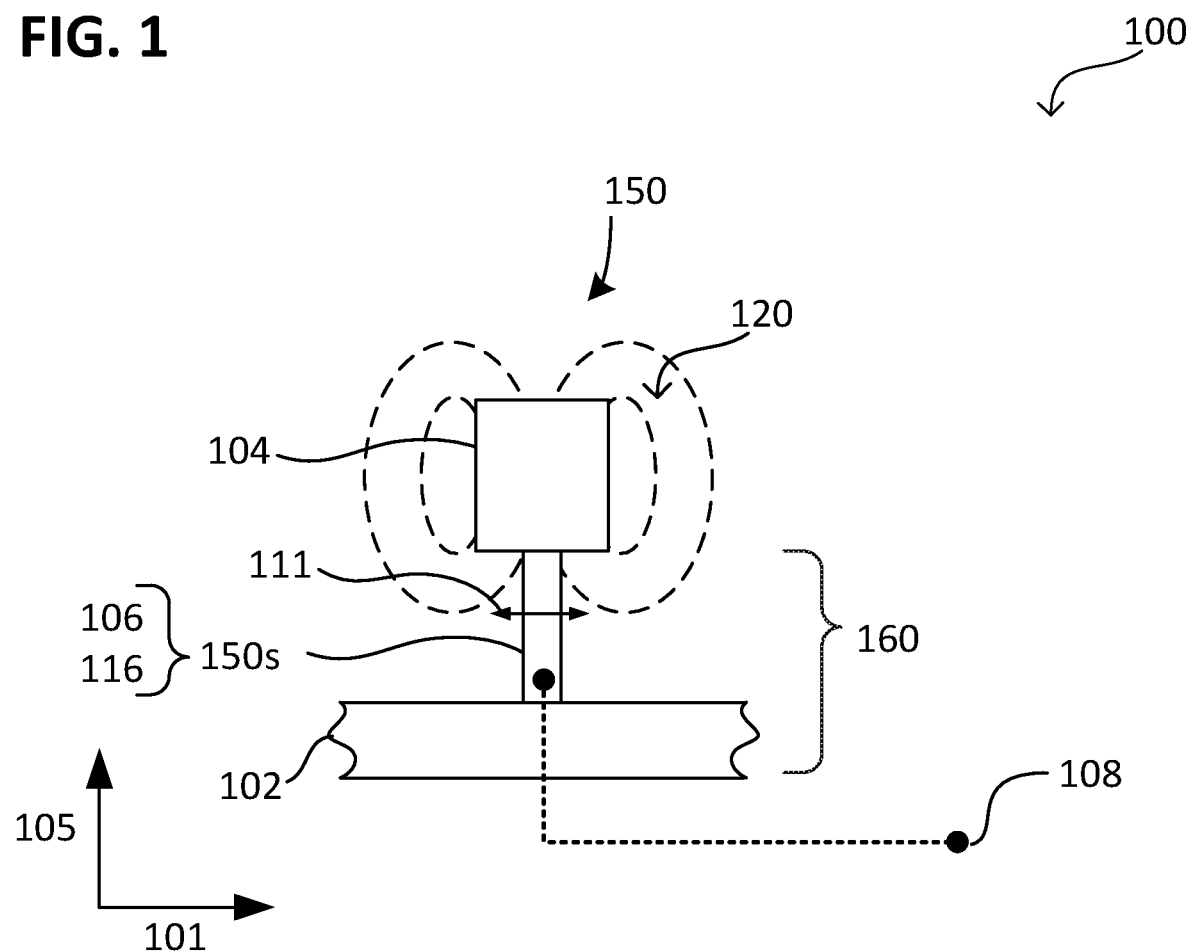

The following detailed description refers to the accompanying drawings that show, by way of illustration, exemplary details and features.

With respect to magnetic fields and sputtering, the spatial distribution of the plasma or the associated atomization rate depends very sensitively on the spatial distribution of the magnetic field. Therefore, the magnet system is of particular importance with respect to various process properties, such as process stability, reproducibility, target utilization and homogeneity. Against this background, there is a fundamental need to improve the magnet system, for example to simplify it and/or to reduce disturbing influences.

One aspect of various embodiments may be illustratively seen in that an adjustable magnetic field is provided. By adjusting the magnetic field, atomization of the target material may be influenced, for example in such a way that atomization and/or coating may be as uniform as possible.

In this respect, it was illustratively recognized that the components used for this purpose for communication (e.g. signal transmission or drive control) as well as power supply (e.g. power generation or power transmission) increase the design complexity of the magnet system, which complicates its maintenance and reduces its reliability.

According to various embodiments, a coherent assembly is provided in the form of a housing cover, which comprises a gear stage, a generator and a rotary coupling (e.g., a rotor through-coupling or a rotary union), and optionally a communication interface. This achieves that the components for power supply and optionally for signal transmission are provided as a structural unit, which may be exchanged as a whole.

The gear stage and the generator are used for internal power generation, while the communication interface is used for signal transmission to the adjustment device (e.g. having a motor control). In addition to safe functional performance during operation, the housing cover may be removed or replaced as a complete assembly during maintenance without having to influence or change the remaining components of the solenoid system.

In the following detailed description, reference is made to the accompanying drawings which form part thereof and in which are shown, for illustrative purposes, specific embodiments in which the invention may be practiced. In this regard, directional terminology such as "top", "bottom", "front", "rear", "forward", "rearward", etc. is used with reference to the orientation of the figure(s) described. Because components of embodiments may be positioned in a number of different orientations, the directional terminology is for illustrative purposes and is not limiting in any way. It is understood that other embodiments may be used and structural or logical changes may be made without departing from the scope of protection. It is understood that the features of the various exemplary embodiments described herein may be combined, unless otherwise specifically indicated. Therefore, the following detailed description is not to be construed in a limiting sense, and the scope of protection is defined by the appended claims.

In the context of this description, the terms "connected", "attached" as well as "coupled" are used to describe both a direct and an indirect connection (e.g. ohmic and/or electrically conductive, e.g. an electrically conductive connection), a direct or indirect connection as well as a direct or indirect coupling. In the figures, identical or similar elements are given identical reference signs where appropriate.

According to various embodiments, the term "coupled" or "coupling" may be understood in the sense of a (e.g. mechanical, hydrostatic, thermal and/or electrical), e.g. direct or indirect, connection and/or interaction. For example, a plurality of elements may be coupled together along an interaction chain along which the interaction may be exchanged, e.g., a fluid (then also referred to as fluidically coupled). For example, two coupled elements may exchange an interaction with each other, e.g., a mechanical, hydrostatic, thermal, and/or electrical interaction. A coupling of a plurality of vacuum components (e.g., valves, pumps, chambers, etc.) to each other may have them fluidically coupled to each other. According to various embodiments, "coupled" may be understood in the sense of a mechanical (e.g., bodily or physical) coupling, e.g., by means of direct physical contact. A coupling may be configured to transmit a mechanical interaction (e.g., force, torque, etc.).

As used herein, the term "bearing device" means a device (for example, comprising an assembly) configured for bearing (e.g., guided positioning and/or holding) one or more than one component. The bearing device may comprise, for example per component (which is supported by means thereof), one or more than one bearing for supporting (e.g. guided positioning and/or holding) the component. Each bearing of the bearing device may be configured to provide the component with one or more than one degree of freedom (for example, one or more than one translational degree of freedom and/or one or more than one rotational degree of freedom) according to which the component may be moved. Examples of a bearing have: Radial bearing, thrust bearing, radial-axial bearing, linear bearing (also referred to as linear guide).

The term "sputtering" refers to the atomization of a material (also referred to as coating material or target material), which is provided as a so-called target, by means of a plasma. The atomized components of the target material are thus separated from each other and may be deposited elsewhere, for example to form a layer. Sputtering may be performed by means of a so-called sputtering device, which may have a magnet system (in which case the sputtering device is also referred to as a magnetron). For sputtering, the magnetron may be placed in a vacuum processing chamber so that sputtering may be performed in a vacuum. To this end, the environmental conditions (the process conditions) within the vacuum processing chamber (e.g., pressure, temperature, gas composition, etc.) may be adjusted or controlled during sputtering. For example, the vacuum processing chamber may be or may be configured to be air-tight, dust-tight, and/or vacuum-tight, such that a gas atmosphere having a predefined composition or pressure (e.g., according to a set point) may be provided within the vacuum processing chamber. For example, an ion-forming gas (process gas) or a gas mixture (e.g., of a process gas and a reactive gas) may be or are provided within the vacuum processing chamber. In a reactive magnetron sputtering process, for example, the atomized material may react with a reactive gas (e.g., comprising oxygen, nitrogen, and/or carbon) and the resulting reaction product (e.g., a dielectric) may be deposited.

Sputtering may be performed by means of a so-called tubular magnetron, in which a tubular target (also referred to as a tube target or tubular cathode) containing the target material rotates axially around the magnet system. By adjusting the magnet system or by changing the magnetic field generated with it, the sputtering of the target material and thus the spatial distribution with which the target is ablated may be influenced.

The tubular cathode and magnet system may be supported by means of a bearing device (also referred to as a target bearing device) that rotatably supports the tubular cathode relative to the magnet system, for example. The bearing device may have, for example, one or more than one end block, each end block of the bearing device holding an end portion of the tubular cathode and magnet system, respectively. The bearing device (e.g., its one or more than one end block) may further provide a supply of electrical power, rotary motion, and/or cooling fluid to the tubular cathode.

According to various embodiments, an end block (then also referred to as a drive end block) of the sputtering device may include a drive train for transmitting rotary motion to the tubular cathode, which may be coupled to a drive, for example. Alternatively or additionally, an end block (also referred to as a media end block) of the sputtering device may be configured to supply and discharge cooling fluid (e.g., a water-based mixture) that may be passed through the cathode.

However, exactly one end block (also referred to as a compact end block) may be used, which has the drive train and fluid line and thus provides the functions of a drive end block and a media end block together. For example, the side of the tube target opposite the compact end block may be freely cantilevered (i.e., freely suspended), which is referred to as a cantilever configuration, or supported by means of a bearing block.

The magnet system may be multipolar, i.e., have multiple magnetic poles. Of the plurality of magnetic poles, a first magnetic pole (also referred to as an outer pole) may extend along a self-contained path (also referred to as a circulatory path) and a second magnetic pole may be disposed within the area enclosed by the circulatory path (also referred to as an inner pole). The circulatory path may be oval-shaped, for example. Each magnetic pole may have a plurality of pole bodies, e.g., magnets (then also referred to as a row of magnets or a magnet row), lined up in series, each pole body being magnetized or having magnetization. For example, each magnetic pole may have at least 10 (e.g., at least 100) pole bodies, e.g., magnets, per meter. For example, two or more rows of magnets disposed between the end pieces of the magnet system may provide substantially the center region of the magnet system (illustratively one row the inner pole, one row of magnets on each side of the inner pole the outer pole). Generally, the outer pole and the inner pole may be spaced apart from each other and/or may differ from each other in their direction of magnetization and/or in their number of magnets.

As used herein, the term "pole body" means a body having or formed from a magnetic material (also referred to as magnet material). For example, the pole body may be adjacent to or part of a magnetic pole. The magnetic material may be, for example, ferromagnetic or ferrimagnetic. The magnet material may comprise or be formed from hard-magnetic magnet material and/or soft-magnetic magnet material. The magnet material may have a magnetic polarization, such as a magnetization, such that a magnetic dipole is provided.

For example, the hard-magnetic magnet material may have a coercivity greater than about 500 kiloamperes per meter (kA/m), e.g., greater than about 1000 kA/m. For example, the hard-magnetic magnet material may comprise or be formed from neodymium-iron-boron ($Nd_2Fe_{14}B$) or samarium-cobalt ($SmCo_5$ and $Sm_2Co_{17}$). More generally, the hard-magnetic magnet material (e.g., the or each permanent magnet) may comprise or be formed from a rare earth magnet material (such as neodymium-iron-boron (NdFeB) or samarium-cobalt (SmCo)), a ferrite magnet material (e.g., a hard ferrite magnet material), a bismanol magnet material, and/or an aluminum-nickel-cobalt magnet material.

For example, the soft-magnetic magnet material may have a coercivity of less than about 500 kA/m, e.g., of less than about 100 kA/m, e.g., of less than about 10 kA/m, e.g., of less than about 1 kA/m. The soft-magnetic magnet material may comprise or be formed from, for example, an alloy of iron, nickel, and/or cobalt, steel, a powder material, and/or a soft ferrite (e.g., comprising nickel tin and/or manganese tin).

For example, the magnet material or magnetic (e.g., soft-magnetic and/or hard-magnetic) material may have a magnetic permeability of about 10 or more, e.g., about 100 or more, e.g., about $10^3$ or more, e.g., about $10^4$ or more, e.g., about $10^5$ or more.

The magnet system, e.g. its so-called magnet bar, may optionally comprise several segments (also referred to as magnet system segment or as magnet system group) arranged one behind the other and/or spatially separated from each other (e.g. multipolar), of which two segments (also referred to as reversing segments or end pieces) are arranged at the end faces (illustratively at the magnet system end) of the magnet system and of which one or more than one optional segment (also referred to as middle piece) is arranged between the end pieces. Reference is made herein by way of example to a magnet system having a plurality of magnet system groups, wherein what is described with respect thereto may also apply to an unsegmented magnet system, or what is described with respect to one magnet system group may apply by analogy to a plurality of magnet system groups, and vice versa.

The term "non-magnetic" may be understood to mean substantially magnetically neutral, e.g., also slightly paramagnetic or diamagnetic. For example, the term "non-magnetic" may be understood as having a magnetic permeability of substantially 1, i.e. in a range of about 0.9 to about 1.1. Examples of a non-magnetic material include: Graphite, aluminum, platinum, copper, aluminum, non-magnetic stainless steel, a ceramic (e.g., an oxide).

FIG. 1 illustrates a magnet system 100 according to various embodiments in a schematic detailed view, e.g., looking at that direction 101 (also referred to as reference direction 101) along which the magnet system 100 is elongated. For example, the magnet system may have a length (extent along the reference direction 101) of more than about 0.5 m (meters) and/or less than about 6 m, e.g., in a range from 2 m about to about 5 m and/or more than 3 m.

The magnet system 100 may include a plurality of magnets 104 and a carrier 160 configured to support the magnets 104 of the magnet system 100. The support structure 160 may include at least one (i.e., one or more than one) carriers 102, 202 (also referred to as magnet carriers or magnet holders), a first carrier 102 (also referred to as a first magnet carrier/holder or system carrier) of which is configured to support one or more than one magnet system group 150 of the magnet system 100 (e.g., magnets 104 thereof).

For example, the magnet system 100 may include one or more than one magnet system group 150 per system support 102, e.g., multiple magnet system groups 150 per system support 102. For example, the magnet system 100 may include two magnet system groups 150 (e.g., per system support 102) or more, e.g., three magnet system groups 150 or more. Each magnet system group 150 may have a plurality (e.g., three or more) of magnets 104 and may optionally be configured to be adjustable. At least two magnets 104 per magnet system group 150 may differ from each other in their magnetization direction.

Each adjustably configured magnet system group 150 may include an adjustment device 150s that is, for example, (e.g., partially) disposed between and/or couples the system support 102 and the magnet(s) 104 of the magnet system group 150. The adjustment device 150s may be configured to change a spatial distribution of the magnetic field 120 generated by the magnet system group 150, for example, by changing a spatial distribution (e.g., position and/or orientation) of the magnet(s) 104 of the magnet system group 150. For example, the adjustment device 150s may be a component of the support structure 160 and configured to change the spatial position and/or orientation of at least one magnet of the magnet system 100.

Exemplary components of the adjustment device 150s include: a bearing device 116 (also referred to as a group bearing device) and/or an actuator 106. The adjustment device 150s (e.g., its group bearing device 116 and/or actuator 106) may couple the or each magnet 104 of the magnet system group 150 to the system support 102. The group bearing device 116 may provide the magnets 104 with one or more than one translational degrees of freedom 111, of which a first translational degree of freedom 111 may be along the reference direction 101 and/or one or more than one second translational degrees of freedom may be transverse to the reference direction 101.

If one or more than one magnet system group 150 of the magnet system 100 is configured to be adjustable, or if the magnet system 100 has one or more than one adjustment device 150s, the support structure 160 may have, e.g. per magnet system group 150, a second carrier 202 (also referred to as a second magnet carrier/holder or as a group carrier) which couples the plurality of magnets 104 (cf. also FIG. 2) to each other and/or to the adjustment device 150s. In that case, the or each group carrier 202 may be magnetic (then providing the so-called return carrier) and the system carrier 102 may be non-magnetic. If the magnet system 100 does not have a group carrier 202, the system carrier 102 may be magnetic (then providing the so-called return carrier). In some embodiments, the return carrier may be plate-shaped or include at least one plate (then also referred to as a return plate).

The actuator 106 may be configured to mechanically move the magnets 104 according to the or each translational degree of freedom 111 (also referred to as actuation). To this end, the actuator 106 may be coupled to the magnet 104 and/or the system support 102 such that when the actuator 106 is actuated, an attitude (i.e., orientation and/or position) of the magnet 104 relative to the system support 102 may be changed, e.g., according to a desired state.

To generate the motion, the actuator 106 may include an electromechanical transducer (e.g., an electric motor or piezoelectric actuator). The electromechanical transducer may be configured to generate translational motion (e.g., in the case of a linear electric motor) or to generate rotational motion (e.g., in the case of a rotary electric motor). To transmit motion to the magnets 104, the actuator 106 may optionally include a gearbox (also referred to as an actuator).

To supply electrical power (also referred to as supply power) to the actuator 106 and/or to supply a communication signal to the actuator 106, the actuator 106 may be coupled to one or more than one electrical line 108. In principle, the communication signal and the supply power may be supplied together via one line 108, but need not be. They may also be supplied via separate lines 108.

Figure 2:
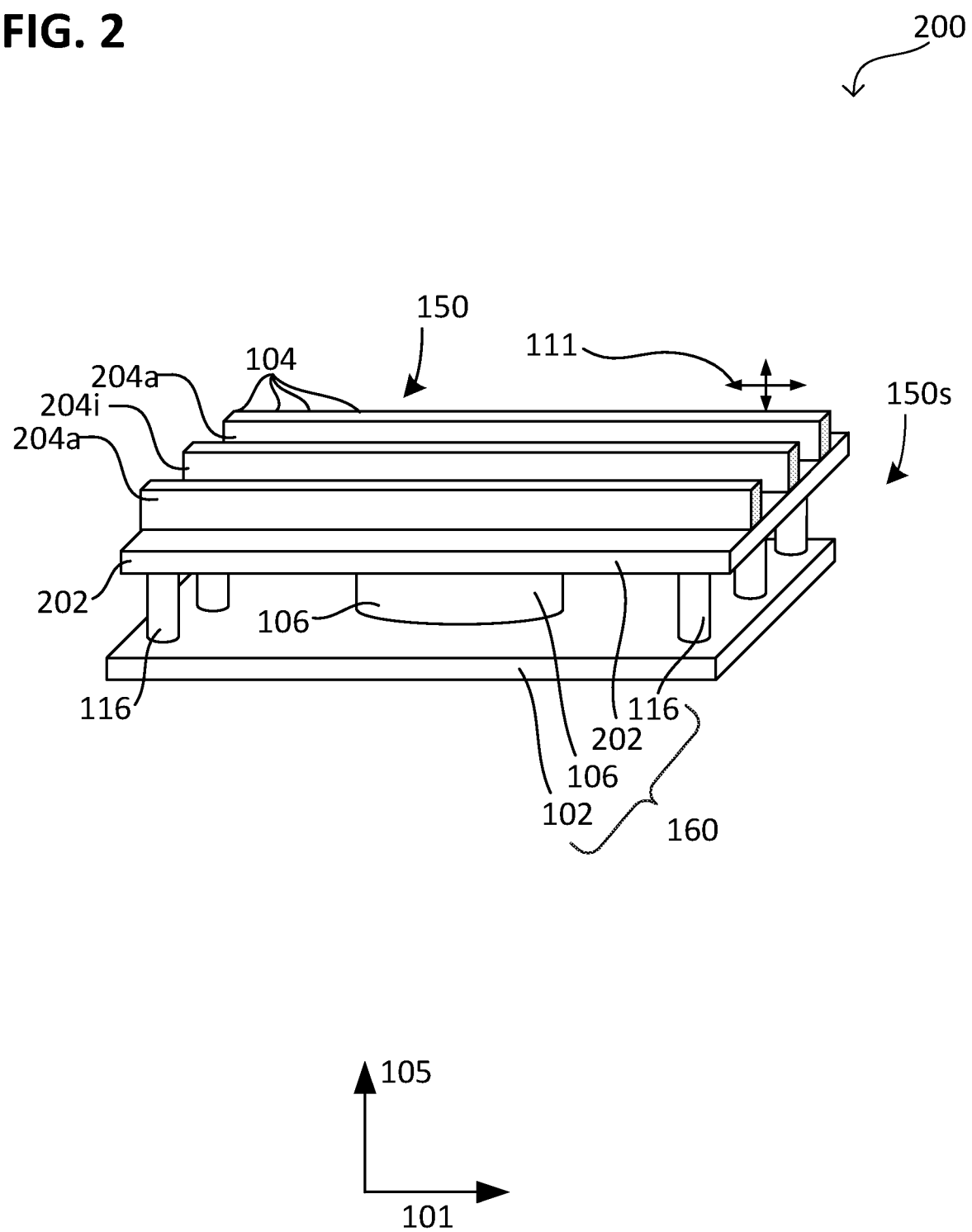

FIG. 2 illustrates the magnet system 100 according to various embodiments 200 in a schematic perspective view.

According to various embodiments, the magnet system 100, e.g., each of its magnet system groups 150, may have a plurality of spatially separated magnet rows 204a, 204i mounted on (e.g., magnetically coupled to) a common group support 202. Each of the magnet rows 204a, 204i may comprise a plurality of magnets of the same magnetization direction arranged in series one behind the other. At least the middle magnet row 204i, which is arranged between two magnets of the outer magnet row 204a, may be elongated in the reference direction 101.

Figure 3A:
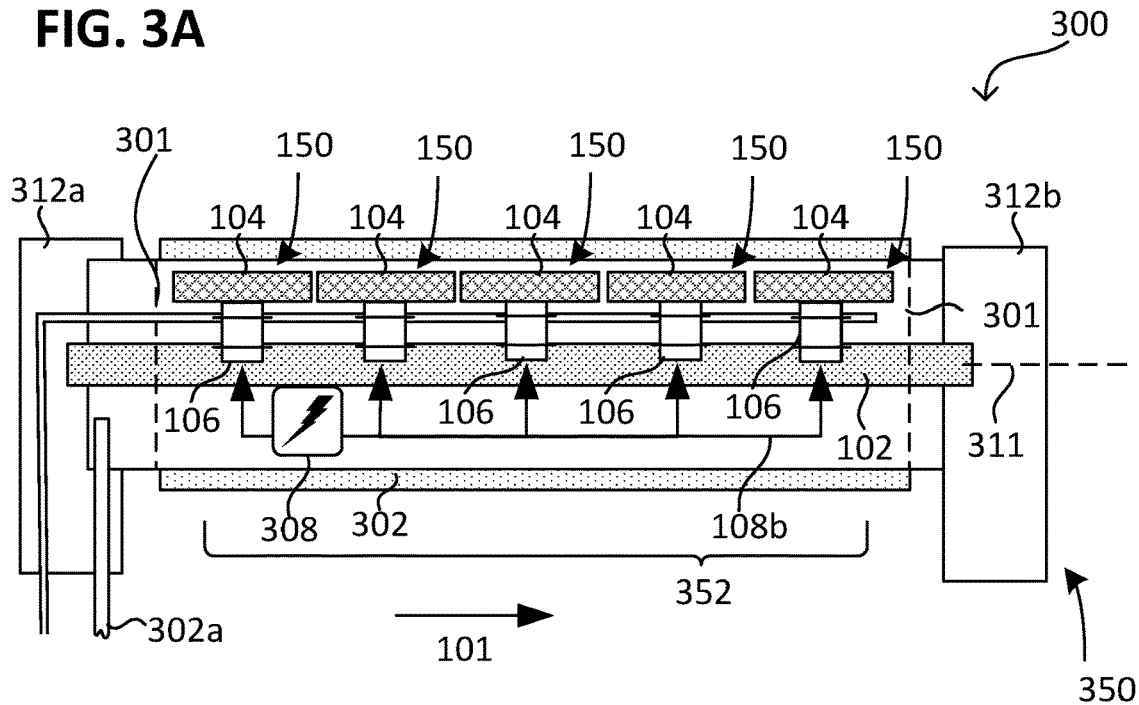
Figure 3B:
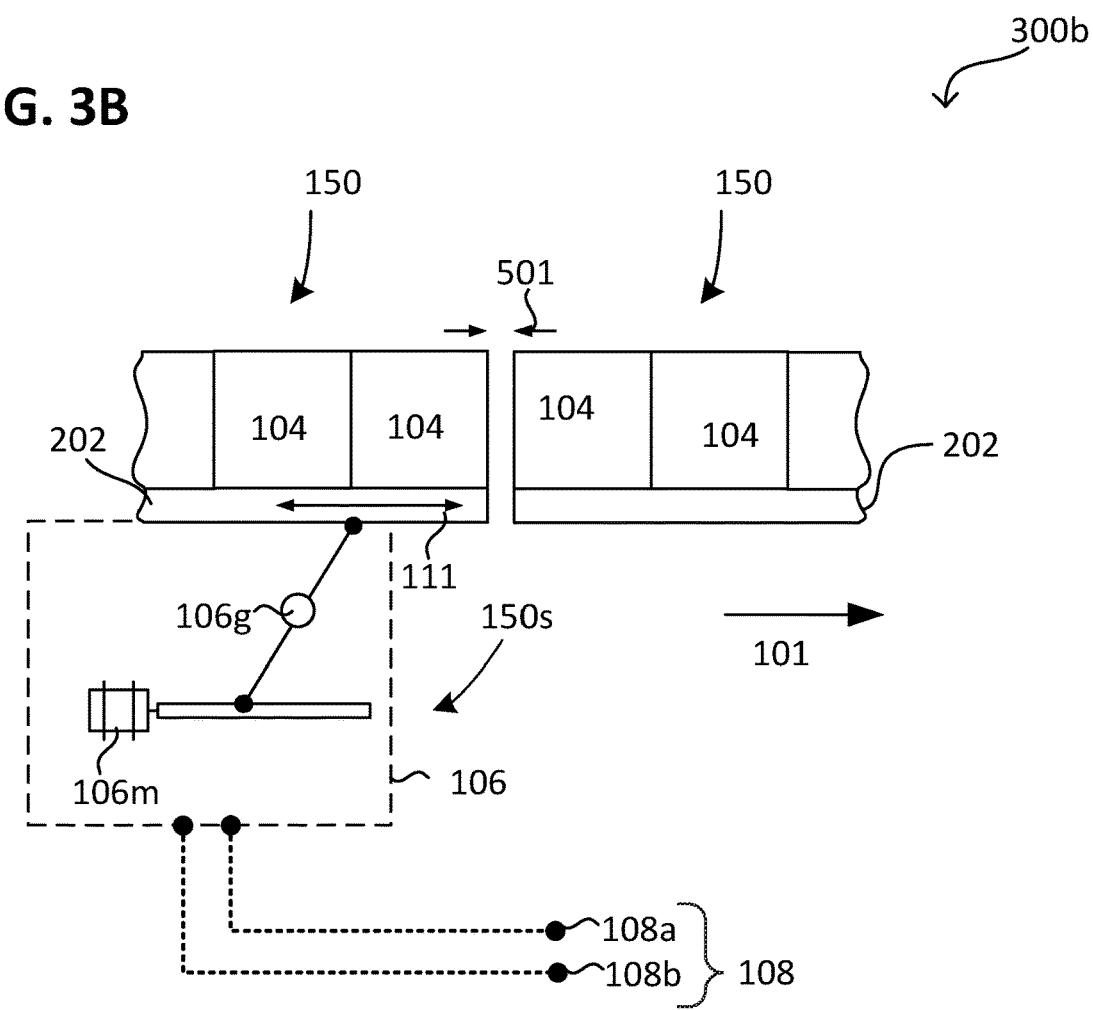
FIG. 3B shows a magnet system of the sputtering device.

FIG. 3A illustrates a sputtering device 300 according to various embodiments in a schematic side view or cross-sectional view, and FIG. 3B illustrates the magnet system 100 of the sputtering device 300 in a schematic detailed view 300b.

The sputtering device 300 may include a bearing device 350 (also referred to as a target bearing device) for rotatably supporting a tubular target 302 (also referred to as a tube target). The target bearing device 350 may include one or more than one end block 312a, 312b by means of which the tubular target 302 may be rotatably supported, e.g., about an axis of rotation 311, and/or fed. To this end, the target bearing device 350 (e.g., each end block 312a, 312b) may include one or more than one corresponding pivot bearing. Per rotary bearing, for example, a target coupling 301 (e.g., comprising a target connection flange) may be rotatably supported to which the tubular target 302 may be coupled. The axis of rotation 311 may be along reference direction 101.

A first end block 312a of the target bearing device 350 may be configured as a drive end block 312a, i.e., having a drive train 302a for rotating the tubular target 302. A second end block 312b of the target bearing device 350 or the first end block 312a may be configured as a media end block 312b, i.e., for supplying and discharging a cooling fluid (e.g., comprising water) and/or for supplying electrical power to the tubular cathode 302. The cooling fluid may be directed through the tubular target 302.

The drive train 302a may be coupled to or include a drive device (e.g., a motor) disposed outside of the drive end block 312a. By means of the drive train 302a, torque may be coupled to the tubular target 302 for driving rotational movement of the tubular target 302.

Further, the sputtering device 300 may include the magnet system 100 held by the bearing device 350, e.g., stationary and/or rotationally fixed relative to a direction of gravity. For example, the magnet system 100 may remain in a fixed orientation with respect to the direction of gravity as the tubular target 302 rotates (around the magnet system 100).

The bearing device 350 may comprise a rotatably mounted target coupling 301 per end block 312a, 312b by means of which the tubular target 302 may be coupled, for example, to the drive train 302a and/or to the cooling fluid supply (e.g., comprising one or more than one fluid line). For example, the target coupling 301 may include a releasable connection that may allow assembly and disassembly of the tubular target 302. The target coupling 301 may further be penetrated by a fixed bearing, by means of which the magnet system 100 may be supported.

Detail view 300b illustrates an exemplary pair of magnet system assemblies 150, each magnet system assembly comprising an assembly support 202; a plurality of magnets 104 coupled together (e.g., magnetically) by the assembly support 202; and an electrical actuator 106 configured to adjust the position of the assembly supports 202 and/or the magnets 104 relative to the system support 102 and/or relative to each other in response to the electrical communication signal supplied to the actuator 106. For example, the actuator 106 includes an electric motor 106m and an optional actuating gear 106g. The actuator 106g may couple the motor 106m to the group carrier 202.

Further, the magnet system 100 may include an electrical generator 308 configured to supply electrical power (also referred to as supply power) or supply voltage to each of the actuators 106. To this end, the line 108 may include one or more than one electrical supply lines 108b coupling the generator 308 to each of the actuators 106.

Further, the line 108 may include one or more than one communication line 108a coupled to one of the end blocks by means of a communication interface. For example, the communication interface of the communication line 108a may be used to couple the communication signal from the end block.

FIG. 4 illustrates the magnet system 100 according to various embodiments 400 in a schematic side view or cross-sectional view (looking along the reference direction), in which the magnet system 100 includes a longitudinally extending magnet bar 352 (also referred to as a magnet bar).

The magnet bar 352 includes the support structure 160 and the plurality of magnets 104, for example, the system support 102 and a magnet system group 150 or a plurality of magnet system groups 150 arranged in series (along the reference direction 101 or axis of rotation 311).

As exemplified, the system support 102 may comprise or consist of a sectional support, e.g., having a U-section, e.g., (as shown) a double U-section (also referred to as an H-section), or the like. The U-section (or double U-section) allows for high stability while providing sufficient installation space for one or more than one additional component 402 of the magnet system 100.

Examples of the additional component 402 of the solenoid system 100 have: the actuator 150s or at least its actuator 106 and/or at least its group bearing device 116, an electrical component 450 (e.g., a processor or other circuit, a generator 308, an inverter, or the like).

In some, but not necessarily all, embodiments, the magnet system 100 includes a base frame 414 (also referred to as a bearing frame 414) and one or more than one support device 404. The or each support device 404 may be mounted to the magnet bar 352 (e.g., the system support 102 thereof) and may be mated (e.g., interlocked) with the bearing frame 414 to form a bearing (e.g., floating bearing) for the magnet bar 352.

According to various embodiments, the magnet system 100 comprises a housing 406g (illustratively a hollow body) having a housing interior 406h in which the magnet bar 352 is disposed, and an optional cold trap 408. The cold trap 408 may be adjacent to or at least partially (i.e., partially or fully) disposed within the housing interior 406h and configured to dry the housing interior 406h. For example, the cold trap 408 may include one or more than one fluid conduit 408f, e.g., two or more (e.g., three, four, or more than four) fluid conduits 408f, by means of which the cooling fluid is supplied to the target.

In a particularly simple and cost-effective implementation, the housing 406g is tubular (e.g., comprising a housing tube), e.g., having a circular cross-section and/or comprising a round tube. This increases the compactness and/or rigidity of the magnet system 100.

Figure 5:
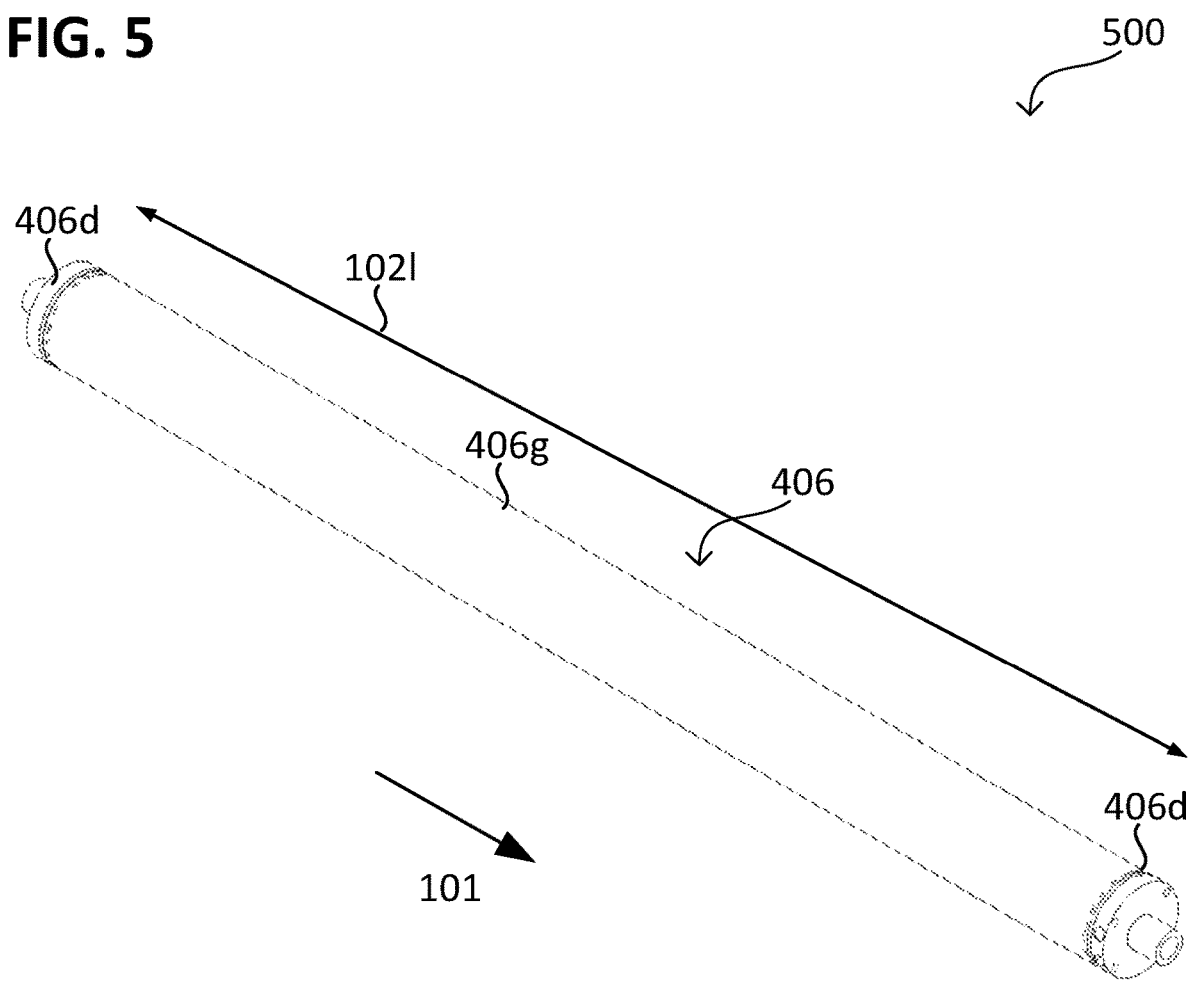
FIGS. 5-6 each show a magnet system according to various embodiments in different views.

FIG. 5 illustrates the magnet system 100 according to various embodiments 500 in a schematic side view or cross-sectional view, in which the magnet system 100 comprises a (e.g., fluid-tight, e.g., vacuum-tight) chamber 406 (also referred to as a system chamber 406) comprising the housing 406g and one or more than one cover 406d (also referred to as a connector cover 406d or housing cover 406d). The or each housing cover 406d may be configured to close (e.g., fluid-tight, e.g., vacuum-tight) the housing 406g end-to-end (e.g., from or in the reference direction 101). Optionally, at least one housing cover 406d of the system chamber 406 may be configured to supply the or each magnet system group 150 of the magnet system 100 (then also referred to as a supply cover), e.g., with the communication signal and/or with the supply power or supply voltage. To this end, the supply cover 406d may include a gear stage, a generator 308, a communication interface, and/or a rotary coupling (e.g., a rotor through-coupling or a rotary union), as described in more detail below.

Figure 6:
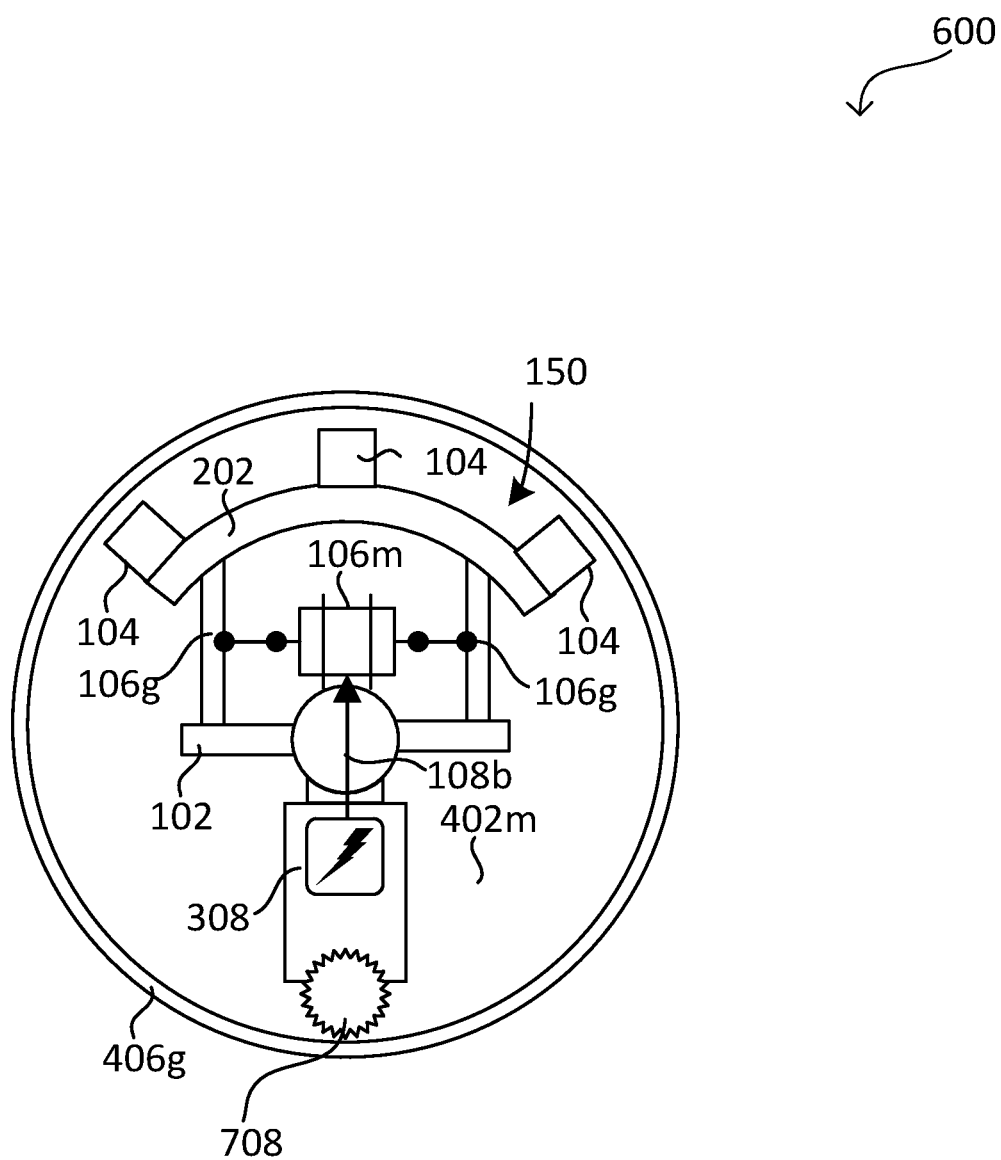

FIG. 6 illustrates the magnet system 100 according to various embodiments 600 in a schematic side view or cross-sectional view (looking along the reference direction 101). Once the system chamber 406 is assembled, the generator 308 may be electrically coupled to each magnet system assembly 150 when disposed within the housing 406g. Further, the generator 308 may be coupled to the gear stage 804 (see FIG. 8). Examples of components of the gear stage have: a planetary gear, an inner toothed rim, an outer toothed rim, and/or one or more than one other type of gear.

Generally, a gear stage herein refers to the wheel pairing between two gear wheels (also referred to as a driving gear wheel and a driven gear wheel) at which the speed or torque changes. Reference is made herein to a gear pair as an exemplary gear pair, it being understood that what is described in this regard may apply by analogy to any other type of gear pair.

The gear pair of the gear stage has two (e.g. toothed) gears as gear wheels (also referred to as first gear wheel and second gear wheel 708). The first gear may be arranged on the drive side, and the second gear 708 (more generally, a generator gear 708) may be arranged on the generator side. For example, the gear stage may include an external ring gear or a gear of a type other than a generator gear 708 that supplies torque to the generator 308. For example, the gear stage (e.g., having at least 2 gears) may be configured as an internally geared gear stage, as will be described in more detail later. For example, the internally toothed gear stage may include at least 2 gears, one of which is internally toothed and the other of which is externally toothed.

When the tubular target 302 is rotated, the rotational motion of the tubular target 302 may be coupled to the generator 308 by means of the gear stage. The generator gear 708 may be coupled to a rotor of the generator 308 (also referred to as the generator rotor), such that the coupled rotational motion is transmitted to the generator rotor.

The or each gear stage of the solenoid system 100 may be configured to provide a greater speed on the generator side than is coupled to the gear stage on the drive side.

Figure 7:
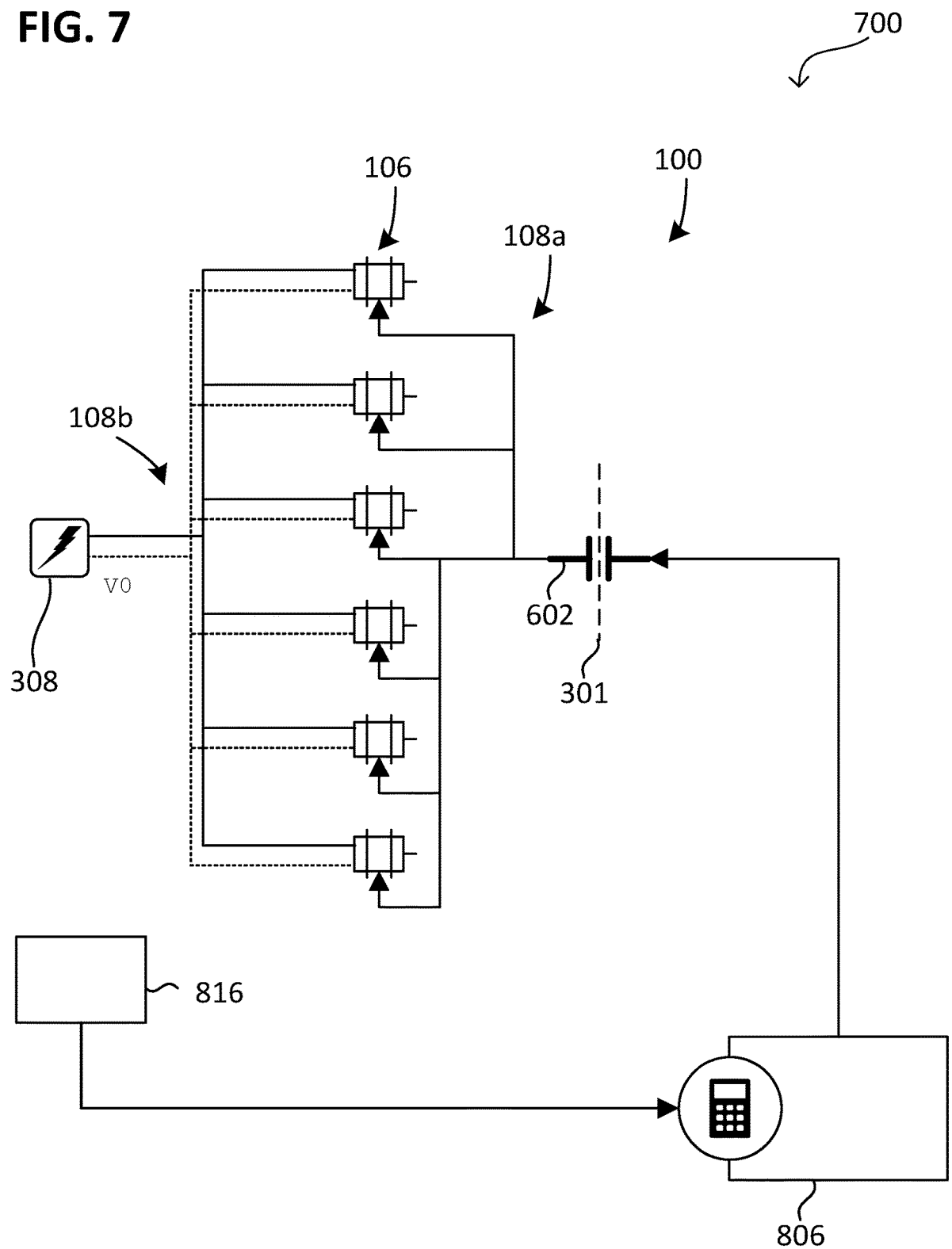
FIG. 7 shows a sputtering device according to various embodiments.

FIG. 7 illustrates the sputtering device 300 according to various embodiments 700 in a schematic circuit diagram. Six actuators 106 of the solenoid system 100 are illustrated here as an example, although their number may also be greater than or less than six. Optionally, the sputtering device 300 may include a control device 806 (for example, for drive control) that generates the communication signal.

It may be understood that communication between the control device 806 and an actuator 106 of the solenoid system 100 may be performed by means of the communication signal, for example bidirectionally (i.e., back and forth) or unidirectionally (i.e., only from the control device 806 to the actuator 106). In other words, the communication signal may be the carrier of an information transfer between the control device 806 and an actuator 106.

The communication signal may illustratively be an electrical signal by means of which information may be transmitted (also referred to as communication), for example instructions or control data, measurement data, requests and/or responses. The communication by means of the communication signal may be, on a physical level, by means of an exchange of electrical power. The physical level of communication may be by means of physical transmitters. The communication by means of the communication signal may take place, on a logical level, by means of an exchange of information. The logical level of communication may take place by means of data processing, which may be implemented, for example, by means of a processor and/or a program and/or which controls the transmitters. The exchange of electrical power between the transmitters may, for example, be or become modulated according to the information to be transmitted.

For example, communication may be message-based (i.e., based on messages) according to a communication protocol (e.g., a network protocol). For example, a fieldbus network protocol may be used as the communication protocol. For example, a USB bus network protocol may be used as the communication protocol (Universal Serial Bus—USB). Of course, another communication protocol may also be used, which may be proprietary, for example.

For example, information transmitted from the control device 806 to the actuator 106 may represent the desired state that the actuator 106 is to assume. Information transmitted from an actuator 106 to the control device 806 may represent, for example, the actual state of the actuator 106 or an acknowledgement of receipt.

The communication line 108a may be coupled to the communication interface 602. The communication interface 602 may be configured to exchange the communication signal between the control device 806 and one or more than one of the actuators 106. In other words, the communication interface 602 may be configured to relay the communication signal. This may generally be accomplished using optical coupling, inductive coupling, and/or capacitive coupling. These achieve more reliable communication. Illustratively, optical, inductive, and/or capacitive relaying of the communication signal may provide galvanic isolation between the actuator 106 and the control device 806. This galvanic isolation inhibits electrical interference during operation of the solenoid system 100.

Optionally, the communication interface 602 may be configured such that the one or more than one communication channel is interrupted (i.e., opened) and established (i.e., closed), e.g., alternately interrupted and established, in time with the rotational movement of the tubular target. This causes the communication to be clocked according to the rotational motion of the target (i.e., in time with the rotational motion). This clocking achieves more reliable communication. Illustratively, interference originating in the rotational motion of the pipe target 302 may thus be systematic, making it easier to filter out.

It may be understood that this clocked communication may be implemented at the physical level of communication and/or at the logical level of communication. For example, the resistive, optical, inductive, and/or capacitive coupling may be physically interrupted (i.e., opened) and re-established (i.e., closed), e.g., alternately, in time with the rotational movement of the pipe target. Alternatively or additionally, logical communication (e.g., sending and/or receiving data or entire messages) may be clocked so that this is interrupted and re-established.

The generator 308 may be configured to generate the supply voltage during operation (for example, at the target rated speed) of the tubular target 302. This supply voltage may be applied to all of the actuators 106 or, by means of a multiplexer, may be applied individually to only one of the actuators 106 at a time, which is actuated. When one of the actuators 106 is driven, the actuator 106 may receive corresponding electrical power from the generator 308, which is applied for adjusting the magnetic field.

The magnet system 100 may optionally include one or more than one sensor 816 configured to capture the actual state (also referred to as the process state) of a sputtering process (e.g., coating process) provided by the sputtering device 300 and/or the magnetic field of the magnet system 100. The control device 806 may be configured to drive the actuators 106 based on the process state. For example, actuating the actuators 106 may be based on a predetermined target state, such as such that a difference between the process state and the target state is reduced.

A sensor may be part of a measuring chain, which has a corresponding infrastructure (e.g. processor, storage medium and/or bus system or the like). The measurement chain may be configured to control the corresponding sensor, to process its captured measured variable as an input variable and, based on this, to provide an electrical signal as an output variable that represents the actual state of the input variable at the time of capture. The measurement chain may be or is implemented, for example, by means of the control device 806 (e.g., a programmable logic controller—SBS).

Various exemplary implementations of the housing cover 406g, which facilitates the power supply and/or communication implementation described herein, are discussed below.

Figure 8:
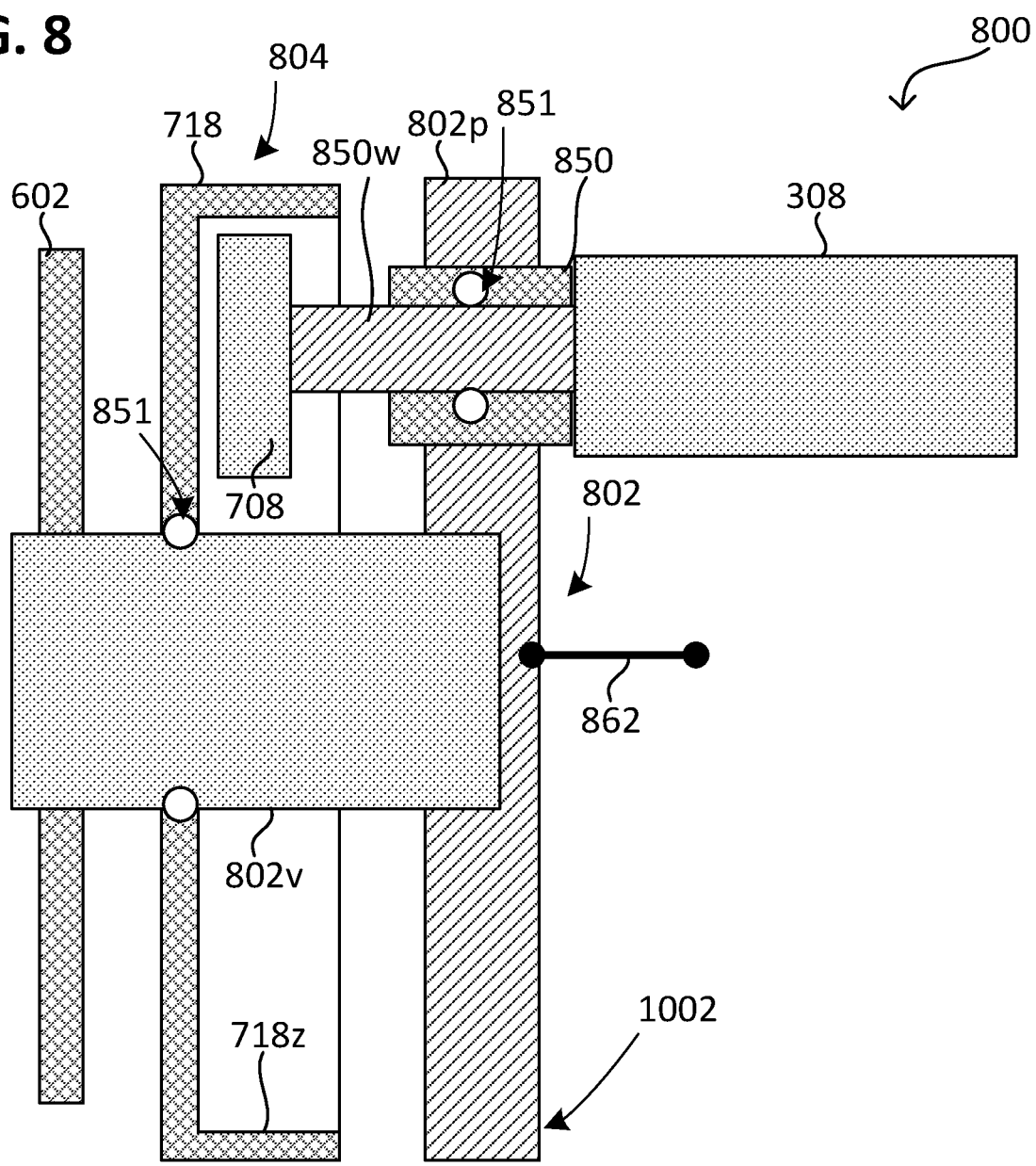
FIGS. 8 and 9 each show a housing cover according to different embodiments in different views.

FIG. 8 illustrates the housing cover 406d of the magnet system 100 according to various embodiments 800 in a schematic cross-sectional view. Illustratively, the housing cover provides a cohesive assembly that is configured to provide power and/or electronic communications, and that better accommodates the geometric characteristics of the available installation space, maintenance requirements, and fluidic requirements.

Generally, the housing cover 406d has a (one-piece or multi-piece) mechanical carrier as the base body 802, which carries the electronic communication and electrical power supply components.

The electrical power supply components include a gear stage 804, a generator 308, and a rotary coupling 850 that couples the gear stage 804 (e.g., its generator gear 708) to the generator 308. The electronic communication components include a communication interface 602 and an electrical connector 862 that are coupled together (e.g., electrically conductive).

Various exemplary implementations of components of the housing cover 406g that facilitate the implementation of the magnet system 100 described herein are discussed below.

In an exemplary implementation of the generator 308, the generator 308 may be elongated and/or extend away from the gear stage 804. This improves the use of installation space. In an alternative or the exemplary implementation of the generator 308, the generator 308 may include an additional gear stage 308s (compare FIG. 9). This improves the generator efficiency.

In an exemplary implementation of the base body 802, the base body 802 may include a flange 802p and a (e.g., peg-shaped) support device 802v that extends away from the flange 802p and/or is electrically conductive. The support device 802v and the flange 802p may be, for example, fixedly (e.g., rigidly) and/or electrically conductively coupled to each other.

The generator 308 may be fixedly (e.g., rigidly) connected, e.g., with its end face, to the base body 802, e.g., its flange 802p. Alternatively or additionally, the communication interface 602 may be fixedly (e.g., rigidly) connected to the base body 802, e.g., its support device 802v.

The base body 802 (also referred to as the cover base body) is disposed at least partially (e.g., at least its flange 802p) between the gear stage 804 and the generator 308. The rotary coupling 850 allows an exchange of a rotary motion through a through-hole of the base body 802 (e.g., its flange 802p).

In an exemplary implementation of the electrical connector 862, it may have one or more than one connector terminal and/or be coupled to one or more than one electrical communication line 108a. Alternatively or additionally, the electrical terminal 862 may be electrically coupled, preferably ohmically, to the communication interface 602, e.g., by means of the base body 802 (e.g., its flange 802p and/or its support device 802v).

The gear wheel 718 on the drive side may be supported on the base body 802, e.g. its support device 802v, by means of a rotary bearing 851. Alternatively or additionally, the rotary coupling 850 may have a shaft 850w which is supported by means of a pivot bearing 851 on the main body 802, e.g. its flange 802p.

Figure 12:
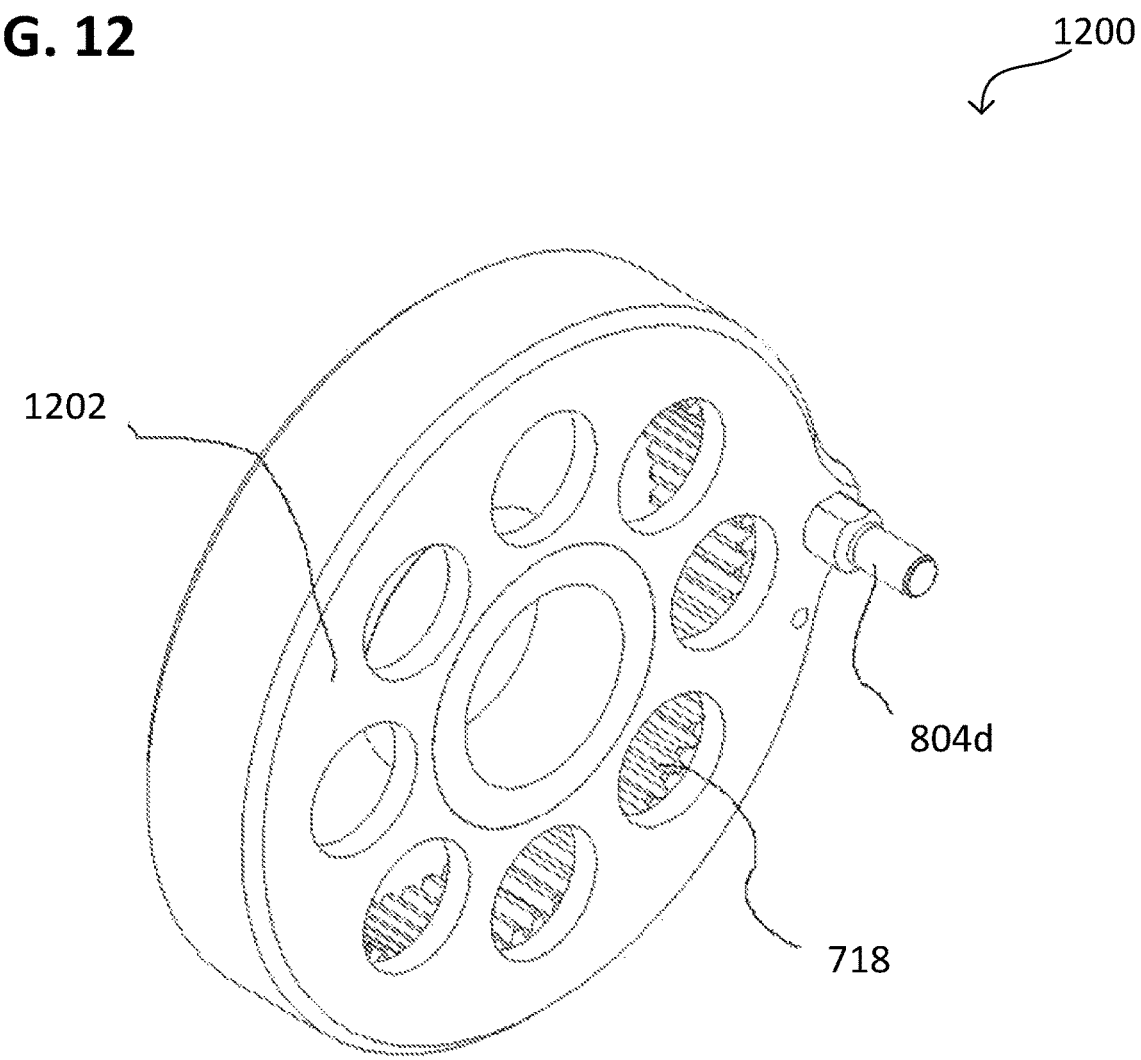
FIG. 12 shows a schematic perspective view of a gear wheel on the drive side of the gear stage according to various embodiments.

If the gear stage is internally toothed, its gear wheel 718 on the drive side has an inner toothed rim 718 (see also FIG. 12). The inner toothed rim 718 illustratively provides a recess in which the generator gear 708 may be arranged. This saves installation space.

Figure 9:
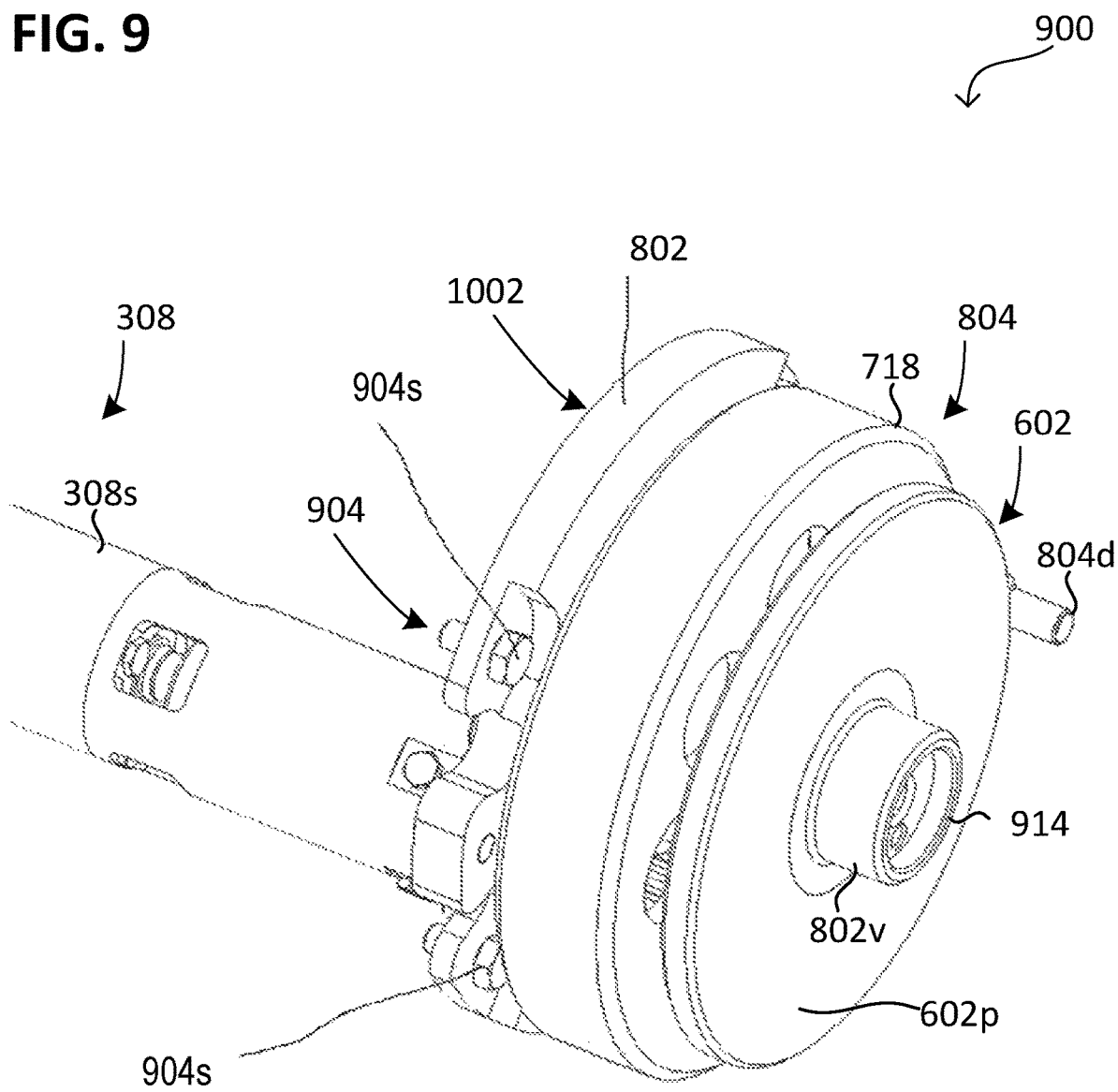

FIG. 9 illustrates the housing cover 406d of the magnet system 100 according to various embodiments 900 in a schematic perspective view in which the cover base body 802 includes one or more than one mounting area 904, 914.

In an exemplary implementation, the flange 802p has one or more than one first mounting area 904, 914 (e.g., each having a through-hole). In an alternative implementation or the exemplary implementation, the support device 802v has a second mounting region 914 or at least extends through the communication interface 602.

Each first mounting area 904 may be configured to mate with the housing 406g such that the lid base body may be mounted (e.g., fluid-tight) to the housing 406g (for axial attachment) using the first mounting area 904. For example, the cover base body 802 may be bolted to the housing 406g using mounting screws 904s that extend through the through-holes in the cover base body 802. The cover base body 802, e.g., its flange 802p, may further include a sealing surface 1002 facing the generator 308. The sealing surface 1002 (e.g., having a groove for receiving a seal) may abut an elastomeric seal, for example, received in the groove.

The second mounting area 914 may be configured to match the target bearing device 350 such that the lid base body may be mounted to the target bearing device 350 (e.g., fluid-tight) by means of the second mounting area 914, e.g., secured against rotation with respect thereto.

In an exemplary implementation, the communication interface 602 comprises an electrode 602p (e.g., comprising an electrically conductive material, e.g., metal), for example in the form of a plate electrode 602p and/or implementing a capacitor plate, for capacitive communication. This reduces the need to run a cable to the end block along the communication path and/or to hardwire them together. For example, the electrode 602*p* (also referred to as the communication electrode) may be configured for non-contact communication with the end block.

The gear stage 804 is configured to extract the rotational motion of the tubular target 302. For this purpose, the gear stage 804 may have a torque support 804*d* (e.g., a driver) on the drive side, which is fixedly (e.g., rigidly) coupled to the gear wheel 718 (also referred to as the first gear wheel) of the gear stage 804 on the drive side. For example, the torque support 804*d* may comprise or consist of a pin.

The torque support 804*d*, e.g. its pin, may be configured to match the target coupling 301 or the target 302 in such a way that they may engage with each other or at least exchange torque with each other during operation.

The torque support 804*d*, e.g., the pivot thereof, may extend away from the generator 308 and/or the flange 802*p*, e.g., past the communication interface 602. Alternatively or additionally, the torque support 804*d*, e.g., the pin thereof, may orbit the communication interface during operation.

The torque support 804*d*, e.g., the pin thereof, may be spaced from an axis of rotation of the drive side gear wheel 718 of the gear stage 804 by a distance greater than one-half of an extent (e.g., diameter) of the communication interface 602. Alternatively or additionally, the gear stage 804 may have a larger diameter than the communication interface 602. This reduces the footprint of the assembly.

Figure 10:
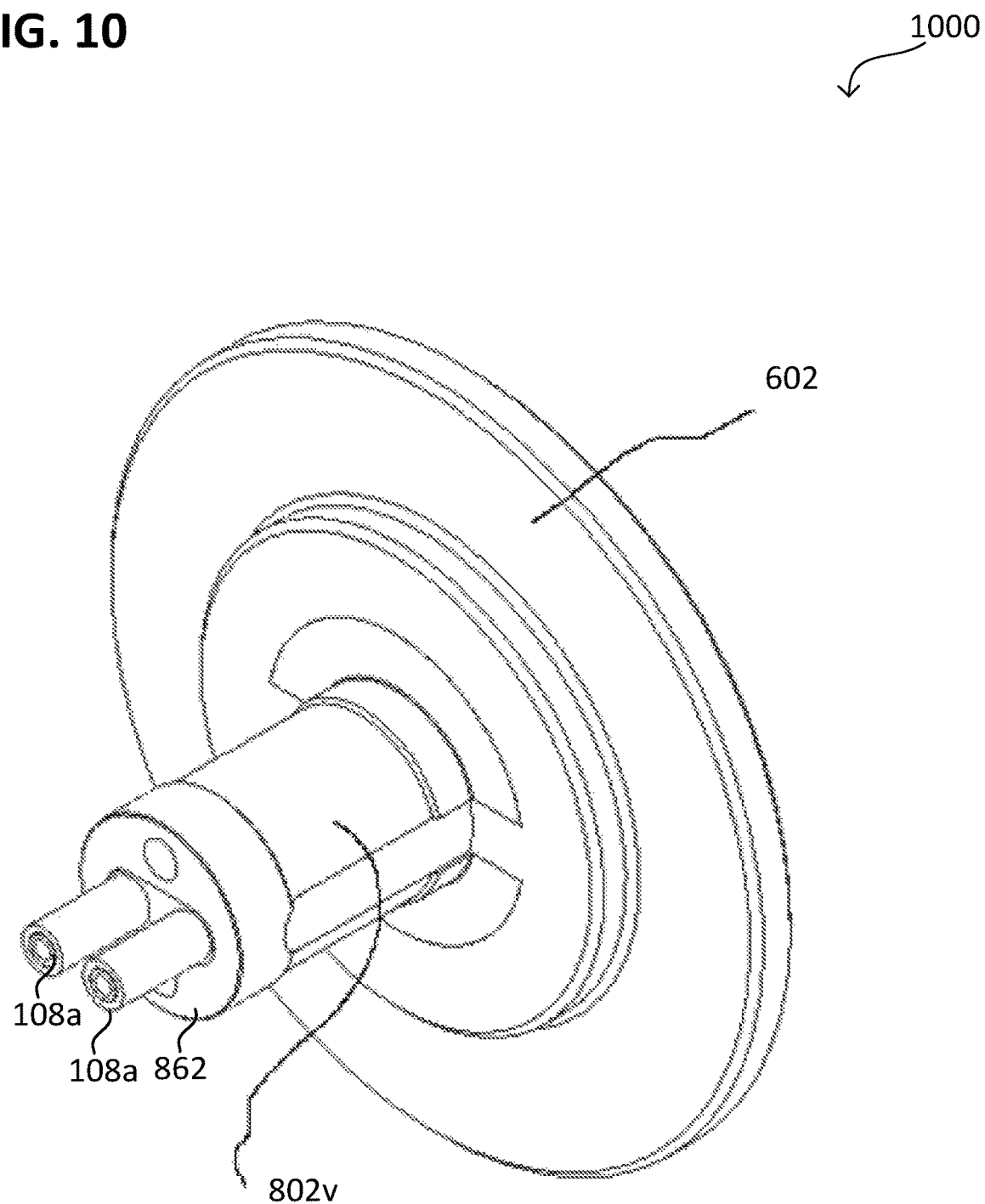
FIG. 10 shows a signal transmission chain of the housing cover according to various embodiments in a similar schematic perspective view.

FIG. 10 illustrates the signal transmission chain of the housing cover 406*d*, which includes the communication interface 602 and the electrical connector 862, according to various embodiments 1000 in a schematic perspective view.

In an exemplary implementation of the communication interface 602, the communication interface 602 may include a plurality of spatially separated (e.g., plate-shaped and/or electrically conductive) electrically conductive segments of an electrode, e.g., the plate electrode. For example, the plate electrode may be provided by means of a segmented and/or disk-shaped plate.

In an alternative or the exemplary implementation of the communication interface 602, the communication interface 602 may include the (and optionally segmented and/or disk-shaped) communication electrode 602*p* (e.g., plate electrode) and a dielectric in which the electrode is embedded. For example, the communication electrode 602*p* may be encapsulated in the dielectric. For example, the communication interface 602 may comprise a fixed, electrically insulated communication disk as a plate electrode, the electrical transmission surface of which is, for example, discontinuous.

For example, the communication interface 602 is fixedly (e.g., rigidly) attached to and/or penetrated by the metallic support device 802*v*.

For example, the electrical connection 862 may be electrically coupled, preferably ohmically coupled, to the communication electrode 602*p* of the communication interface 602, e.g., by means of the support device 802*v*. Alternatively or additionally, one or more than one communication line 108*a* may be electrically coupled, preferably ohmically, to the communication interface 602 (e.g., electrode thereof) by means of the electrical connector 862.

Figure 11:
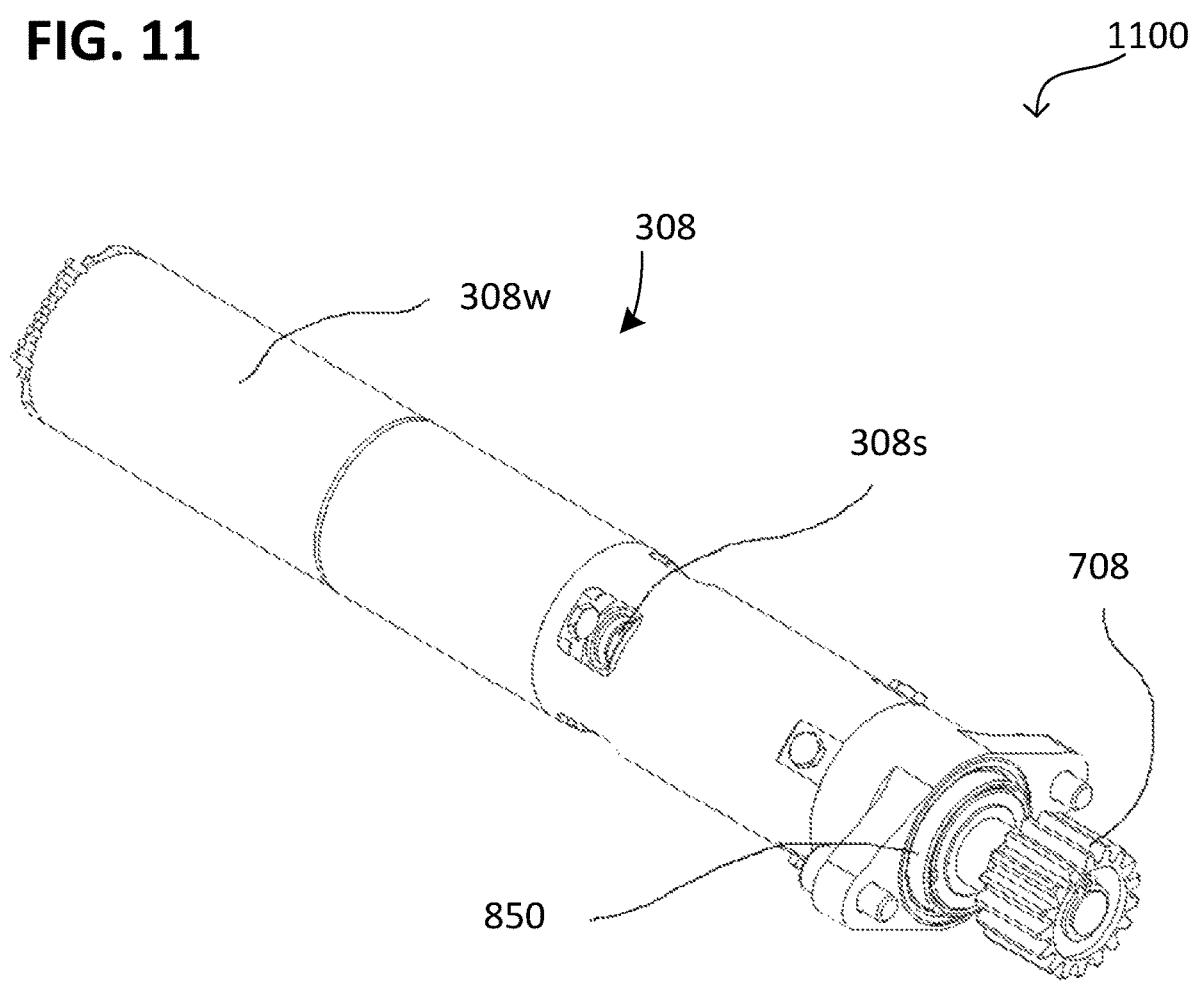
FIG. 11 shows a schematic perspective view of the generator side part of the kinetic chain of the housing cover according to various embodiments.

FIG. 11 illustrates the generator side portion of the torque transmission chain of the housing cover 406*d* according to various embodiments 1100 in a schematic perspective view in which it comprises the generator 308, the generator wheel 708, and the rotary coupling 850. Generally, the generator 308 may include an electromechanical converter 308 which includes, for example, a stator (also referred to as a generator stator) and a rotor (also referred to as a generator rotor).

The generator stator may be disposed or held stationary with respect to the system support 102 and/or the base body 802. When the generator rotor is caused to rotate relative to the generator stator, the generator 308 may provide the supply voltage. The generator stator and/or the generator rotor may include a plurality of coils that generate the supply voltage (using induction). The other of the generator stator or generator rotor may include a plurality of magnets that excite the induction.

In an exemplary implementation of the generator 308, it may be configured as a gear generator, i.e., have an additional gear stage 308*s* (also referred to as a generator gear stage) that couples the gear stage 804 (e.g., its generator gear 708) to the electromechanical converter 308*w* (e.g., its generator rotor). The generator gear stage 308*s* may be configured to provide a greater speed to the generator rotor than is coupled to the generator gear stage.

Alternatively, or in addition to the generator gear stage 308*s*, the generator 308 may include a generator clutch.

FIG. 12 illustrates the drive-side gear wheel 718 according to various embodiments 1200 in a schematic perspective view, in which the gear wheel 718 has a running disk 1202 that couples the torque support 804*d* (e.g., the driver or pin) to the inner toothed rim 817 and is supported on the base body 802, e.g., its support device 802*v*, by means of the pivot bearing 851. This reduces the required installation space.

The geometric characteristics of the available installation space within the housing 406*g* relate, for example, to the space conditions in the housing 406*g*, according to which the generator 308 exerts as few structural restrictions as possible on the magnet bar 352 in terms of size and arrangement. The housing cover 406*d* is configured, for example, such that an inner gear stage 308*s* (e.g., the generator gear stage within the housing tube) and outer gear stage 804 are configured to provide the same position of the generator 308; provide reliable power generation based on target rotation; and provide a capacitor disk for communication that covers a large circular area, is water resistant, and is insulating to the outside; and, in the event of maintenance, does not require disassembly of the housing cover 406*g* and/or of the assemblies inside the housing 406*g* is necessary, or that the housing cover 406*d* may be completely replaced. This reduces the user's effort with respect to assembly and inspection procedures of the magnet system 100.

In the following, various examples are described that relate to what has been described above and what is shown in the figures.

Example 1a is a housing cover (preferably configured according to any of examples 1 to 14), comprising: a first (e.g. non-magnetic) gear wheel (preferably comprising a recess) and a generator (e.g. comprising a gear stage), a (e.g. non-magnetic) flange, which is penetrated by a through-hole, is arranged between the first gear wheel and the generator and preferably has a sealing surface on a side facing the generator; wherein the generator (e.g. its stator), preferably its stator, is arranged between the first gear wheel and the generator, preferably on its front side, is coupled to the flange, and/or is rod-shaped; a second gear wheel, which is coupled to the first gear wheel (e.g. contacting it) and is preferably arranged in the recess of the first gear wheel; a rotary coupling (e.g. partly arranged in the through-hole), which couples the second gear wheel to the generator or is at least arranged in the recess of the first gear wheel to couple a torque of the second gear wheel to the generator therethrough; wherein the generator extends preferably away from the flange (e.g., in an axial direction) and/or rod-shaped, and a sealing surface, which is preferably arranged on a side facing the generator. at least configured to couple a rotational movement of the second gear wheel to the generator through the through-hole; wherein the generator preferably extends from the flange; an optional supporting device which is fixedly (e.g., rigidly) coupled to the flange and supports the first gear wheel, wherein the first gear wheel is preferably rotatably supported relative to (and/or around) the flange and/or the generator, e.g. by means of the optional supporting device; an optional electrical connection and an optional plate electrode between which said flange and/or said first gear wheel are arranged and which are electrically conductively, e.g. ohmically, connected to each other (for example by means of the optional electrical connection), wherein optionally the electrical connection is surrounded by the sealing surface; wherein the housing cover is preferably provided as a coherent assembly such that it may be mounted on or demounted from a housing as a whole.

Example 1 is a magnet system comprising: a (e.g. non-magnetic) housing having a housing interior; a (e.g. non-magnetic) magnet holder arranged in said housing interior and supported by means of said housing, preferably stationary with respect thereto; a (e.g. non-magnetic) housing cover (e.g. the housing cover according to example 1a), which together with the housing forms a fluid-tight chamber; wherein the housing cover comprises a gear stage, a generator and a rotary coupling that couples the gear stage to the generator.

Example 2 is the magnet system according to example 1, wherein the housing cover comprises a (e.g. non-magnetic) flange which is arranged between the gear stage and the generator, wherein the rotary coupling couples the gear stage and generator together through the flange.

Example 3 is the magnet system according to example 2, wherein the housing cover has a pivot bearing by means of which a drive-side gear wheel (e.g. first gear wheel) of the gear stage is coupled to the flange.

Example 4 is the magnet system according to any of examples 1 to 3, wherein the gear stage comprises a generator-side gear wheel (e.g., second gear wheel) contacting the drive-side gear wheel and/or the rotary coupling.

Example 5 is the magnet system according to example 1 or 4, wherein the housing cover comprises a drive-side drive coupling which is configured to transmit torque to the gear stage and/or which is carried by the gear stage.

Example 6 is the magnet system of example 5, wherein a drive side gear wheel of the gear stage is fixedly coupled to the drive coupling; and/or wherein the drive coupling includes a torque support (e.g., carrier) attached to the gear stage (e.g., its drive side gear wheel).

Example 7 is the magnet system of example 6, with the torque support extending away from the generator.

Example 8 is the magnet system according to example 1 or 7, wherein the gear stage has an inner toothed rim as the drive-side (or first gear wheel) gear wheel, and/or wherein the gear stage has an outer toothed rim as the generator-side (or second gear wheel) gear wheel.

Example 9 is the magnet system according to any of examples 1 to 8, wherein the housing cover includes a communication interface that is fixedly coupled to the generator, the gear stage being disposed between the generator and the communication interface.

Example 10 is the magnet system according to example 9, wherein the communication interface comprises or consists of a (preferably encapsulated and/or segmented) plate electrode, which is preferably configured to form a capacitive rotary contact; and/or wherein the housing cover comprises an electrical terminal, which is arranged facing the generator (e.g. on a generator facing side of the flange) and is electrically conductively coupled, preferably ohmically, to the communication interface (e.g. its plate electrode).

Example 11 is the magnet system according to example 10, where the plate electrode is encapsulated by means of a dielectric (e.g. as part of the communication interface). This improves the service life.

Example 12 is the magnet system according to any one of examples 1 to 11, further comprising: an actuator electrically powered by means of the generator and having a control input conductively, preferably ohmically, coupled to the housing cover (e.g. its flange, electrical connection and/or communication interface).

Example 13 is the magnet system according to any one of examples 1 to 12, further comprising: at least one magnet coupled to the magnet holder by means of the actuator and disposed in the housing interior, wherein the actuator is configured to change a position of the magnet relative to the magnet holder in response to an electrical communication signal supplied to the control input by means of the rotary coupling.

Example 14 is the magnet system according to any of examples 1 to 13, wherein the rotary coupling comprises a rotatably mounted shaft that couples a generator-side gear wheel of the gear stage (e.g., fixedly) to the generator.

Example 15 is a sputtering device comprising: a bearing device, preferably comprising one or more than one end block, for rotatably supporting a sputtering target; the magnet system according to any one of examples 1 to 13 being fixedly supported (e.g. relative thereto and/or relative to a gravitational direction) within the sputtering target by means of the bearing device.

Example 16 is the sputtering device of example 15, the bearing device further comprising: a fixed bearing supporting the magnet system; and/or a rotary bearing for rotatably supporting the sputtering target.

Example 17 is the sputtering device of example 16, the bearing device further comprising: a coupling rotatably supported by the pivot bearing for coupling the sputtering target, the coupling having a through-hole into which the fixed bearing extends.

The invention claimed is:

1. A magnet system comprising:
   a housing comprising a housing interior;
   a magnet holder arranged in the housing interior and rigidly attached to the housing; and
   a housing cover which, when assembled with the housing, forms a fluid-tight chamber, wherein the housing cover comprises:
   a gear stage;
   a generator; and
   a rotary coupling that couples the gear stage to the generator.

2. The magnet system of claim 1, wherein the housing cover comprises a flange disposed between the gear stage and the generator, wherein the rotary coupling couples the gear stage and generator together through the flange.

3. The magnet system of claim 2, wherein the housing cover comprises a pivot bearing by means of which a drive-side gear wheel of the gear stage is coupled to the flange.

4. The magnet system of claim 3, the magnet system further comprising a supporting device fixedly coupled to the flange, wherein the supporting device rotatably supports the drive-side gear wheel relative to the flange or the generator.

5. The magnet system of claim 1, wherein the magnet holder is mounted so as to be stationary with respect to the housing.

6. The magnet system of claim 1, wherein the housing is non-magnetic.

7. The magnet system of claim 1, wherein the gear stage comprises a generator side gear wheel that contacts the drive side gear wheel or the rotary coupling.

8. The magnet system of claim 1, wherein the housing cover comprises a drive side drive coupling that is configured to transmit torque to the gear stage or that is supported by the gear stage.

9. The magnet system of claim 8, wherein the drive side coupling comprises a torque support attached to the gear stage and extending away from the generator.

10. The magnet system of claim 1, wherein the gear stage comprises an inner toothed rim as a drive side gear wheel of the gear stage.

11. The magnet system of claim 1, wherein the housing cover comprises a communication interface that is fixedly coupled to the generator, wherein the gear stage is arranged between the generator and the communication interface.

12. The magnet system of claim 11, wherein the communication interface comprises a plate electrode, wherein the housing cover comprises an electrical connection, is arranged to face the generator, and is electrically conductively coupled to the plate electrode.

13. The magnet system of claim 1, further comprising:
an actuator electrically powered by the generator, wherein the actuator comprises a control input and is conductively coupled to the housing cover; and
a magnet coupled to the magnet holder via the actuator and arranged in the housing interior, wherein the actuator is configured to change a position of the magnet relative to the magnet holder in response to an electrical communication signal supplied from the rotary coupling to the control input.

14. A sputtering device comprising:
a bearing device; and
a magnet system comprising:
a housing comprising a housing interior;
a magnet holder arranged in the housing interior and rigidly attached to the housing; and
a housing cover which, when assembled with the housing, forms a fluid-tight chamber, wherein the housing cover comprises:
a gear stage;
a generator; and
a rotary coupling that couples the gear stage to the generator, wherein the magnet system is stationarily supported within a sputtering target by means of the bearing device.

15. The sputtering device of claim 14, wherein the gear stage comprises a first gear wheel with a recess and a second gear wheel arranged in the recess of the first gear.

16. The sputtering device of claim 15, wherein the first gear wheel is configured to couple torque from the second gear wheel to the generator.

17. The sputtering device of claim 14, wherein the bearing device comprises a fixed bearing or a rotary bearing.

18. The sputtering device of claim 14, wherein the bearing devices comprises an end block for rotatably supporting the sputtering target.

19. A housing cover comprising:
a first gear wheel;
a generator;
a flange penetrated by a through-hole, wherein the flange is positioned between the first gear wheel and the generator and has a sealing surface on a side facing the generator, wherein the generator is rigidly coupled to the flange on an end face of the flange;
a second gear wheel coupled to the first gear wheel; and
a rotary coupling configured to couple rotary motion of the second gear wheel to the generator through the through-hole, wherein the housing cover is a unitary assembly that may be mounted on or demounted from a housing.

20. The sputtering device of claim 14, wherein the generator comprises a stator, wherein the generator extends away from the flange.

* * * * *